United States Patent [19]

Possin

[11] Patent Number: 4,774,207
[45] Date of Patent: Sep. 27, 1988

[54] METHOD FOR PRODUCING HIGH YIELD ELECTRICAL CONTACTS TO N+ AMORPHOUS SILICON

[75] Inventor: George E. Possin, Schenectady, N.Y.

[73] Assignee: General Electric Company, Schenectady, N.Y.

[21] Appl. No.: 39,854

[22] Filed: Apr. 20, 1987

[51] Int. Cl.[4] ............................................. H01L 21/44
[52] U.S. Cl. ................................... 437/180; 437/187; 437/228; 437/245; 204/192.15; 156/662; 156/664
[58] Field of Search .................. 437/4, 180, 187, 228, 437/245; 204/192.15; 156/662, 664

[56] References Cited

FOREIGN PATENT DOCUMENTS 59-181070 10/1984 Japan ..................................... 136/256
60-180115  9/1985 Japan ........................... 136/258 AM

OTHER PUBLICATIONS

Lakatos, A. I., "Promise and Challenge of Thin-Film Silicon Approaches to Active Matrices", 1982 International Display Research Conference, IEEE, pp. 146-151.
Suzuki, K. et al., "High Resolution Transparent-Type a-Si TFT LCDs", SID Digest, (1983), pp. 146-147.
Snell, A. J., "Application of Amorphous Silicon Field Effect Transistors in Addressable Liquid Crystal Display Panels" *Applied Physics,* vol. 24, pp. 357-362 (1981).
Sugata, M. et al., "A TFT-Addressed Liquid Crystal Color Display", Proceedings of the Third International Display Research Conference, Paper No. 53, (Oct. 1983).
Stroomer, M. V. C., "Amorphous-Silicon TFT Array for LCD Addressing", *Electronics Letters,* vol. 18, No. 20 (1982).

*Primary Examiner*—Aaron Weisstuch
*Attorney, Agent, or Firm*—Lawrence D. Cutter; James C. Davis, Jr.; Marvin Snyder

[57] ABSTRACT

Electrical contact to doped amorphous silicon material is enhanced by depositing a thin layer of molybdenum on the amorphous silicon surface and subsequently removing it. This treatment is found to permanently alter the silicon surface so as to facilitate and improve electrical contact to the silicon material by subsequently deposited metallization layers for source and drain electrode attachment. The layer of molybdenum which is deposited and removed need only be approximately 50 nanometers in thickness to produce desirable results. The method is particularly useful in the fabrication of thin film, inverted, amorphous silicon field effect transistors. Furthermore, such devices are particularly useful in the fabrication of liquid crystal display systems employing such field effect transistors in matrix addressed arrays used for switching individually selected pixel elements.

9 Claims, 2 Drawing Sheets

METHOD FOR PRODUCING HIGH YIELD ELECTRICAL CONTACTS TO N+ AMORPHOUS SILICON

BACKGROUND OF THE DISCLOSURE

The present invention is generally directed to a method for treating a doped amorphous silicon surface to enhance electrical contact. The method is applicable to the production of microelectronic circuit devices, and more particularly, is more applicable to the production of thin film amorphous silicon semiconductors, particularly those employed in liquid crystal display matrix addressed systems.

A liquid crystal display device typically comprises a pair of flat panels sealed at their outer edges and containing a quantity of liquid crystal material. The flat panels generally possess transparent electrode material disposed on the inner surfaces in predetermined patterns. One panel is often covered completely by a single transparent ground plane electrode. The opposite panel is configured with an array of transparent electrodes, referred to herein as pixel (picture element) electrodes. Thus a typical cell in a liquid crystal display includes liquid crystal material disposed between a pixel electrode and a ground electrode forming, in effect, a capacitor-like structure disposed between transparent front and back panels. In general, however, transparency is required for only one of the two panels and the electrodes disposed thereon.

In operation, the orientation of liquid crystal material is effected by voltages applied across the electrodes on either side of the liquid crystal material. Typically, voltage applied at the pixel electrode effects a change in the optical properties of the liquid crystal material. This optical change causes the display of information on the display screen. In conventional digital watch displays and in new LCD displays, screens used in some miniature television receivers, the visual effect is typically produced by variations in reflected light. However, the utilization of transparent front and back panels and transparent electrodes also the permits the visual effects to be produced by transmissive effects. These transmissive effects may be facilitated by subsequently powered light sources for the display including fluorescent type devices. This is typically referred to as back lighting. Various electrical mechanisms are employed to sequentially turn on and off individual pixel elements in an LCD display. Most relevantly, the switch element of the present invention comprises a thin film field effect transistor employing a layer of amorphous silicon. These devices are preferred in many LCD devices because of their potentially small size, low power consumption, switching speed, ease of fabrication, and compatibility with conventional LCD structures.

Thin film field effect transistors made from plasma enhanced chemically vapor deposited (PECVD) amorphous silicon (a-Si) and silicon nitride are ideal for matrix addressing of liquid crystal displays. They are fabricated on glass substrates with high picture element density using methods and equipment employed in conventional integrated circuit fabrication. In one process for FET fabrication and LCD displays, a molybdenum contact is made to N+ amorphous silicon using two masking steps. After a deposition of an insulative material such as silicon nitride, a layer of intrinsic amorphous silicon and the doping of the upper portions of the amorphous silicon layer, a thin layer of molybdenum is sputter deposited. This film is patterned back into small regions called mesas. Then the silicon nitride/silicon layers are patterned into regions somewhat larger than the mesas and referred to herein as islands. Subsequently, thick molybdenum is deposited on the wafer and patterned into source/drain and data line electrodes. The deposition of the thin molybdenum before subsequent processing into islands has been found to be necessary to ensure reliable contact of molybdenum to the N+ silicon. Hence, it is seen that two masking steps are required to form the contact: the mesa and mask and the island mask. Reducing the number of masking steps is desirable because it reduces processing time and in general, increases device yield.

SUMMARY OF THE INVENTION

In accordance with a preferred embodiment of the present invention, a thin layer of molybdenum, about 50 nanometers in thickness, is sputter deposited on the N+ silicon. This molybdenum layer is then removed by etching without any patterning required. The silicon/silicon nitride layer is then patterned into islands as before. Then molybdenum source/drain metal is deposited, patterned and etched and the process is completed. It is the deposition of this thin molybdenum layer and its subsequent removal which is believed responsible for the improvements in electrical contact between the molybdenum source/drain electrodes and the N+ amorphous silicon material.

It is noted that the present method of processing eliminates the need to form molybdenum mesas prior to formation of the source/drain contacts. Thus one masking step is eliminated. It is also noted that, without the present invention, the mesa/island structure is generally required since the overhang problem due to undercutting of the silicon/silicon nitride layers can develop and cause step coverage problems for the source/drain metallization.

Accordingly, it is an object of the present invention to provide a method for improving electrical contact to amorphous silicon materials. It is also an object of the present invention to reduce the number of masking steps required in the formation of amorphous silicon thin film transistors.

It is yet another object of the present invention to increase the yield of thin film field effect transistor devices employed in microcircuit applications.

It is yet another object of the present invention to reduce the number of masking steps and improve the yield in the manufacture of matrix addressed liquid crystal displays.

Lastly, but not limited hereto, it is an object of the present invention to provide a method for treating an amorphous silicon surface, particularly an N+ doped amorphous silicon surface, to enhance electrical contact with said surface, particularly when the subsequent contacting material is molybdenum.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1A:
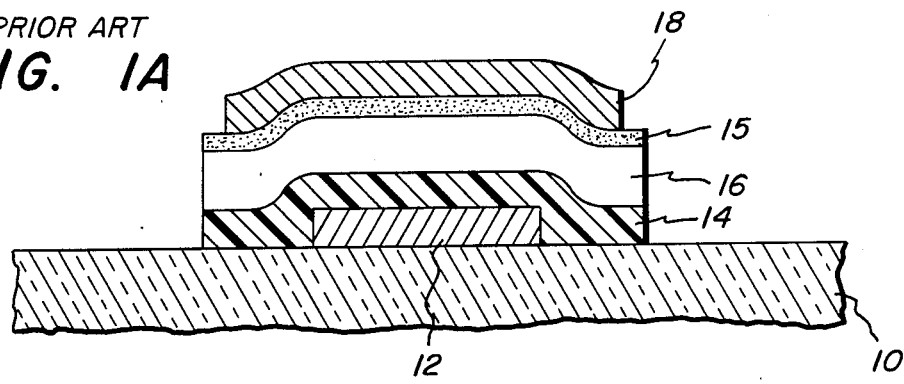
FIG. 1A is a cross-sectional side elevation view illustrating the mesa and island structures present at one stage in thin film FET fabrication.
Figure 1B:
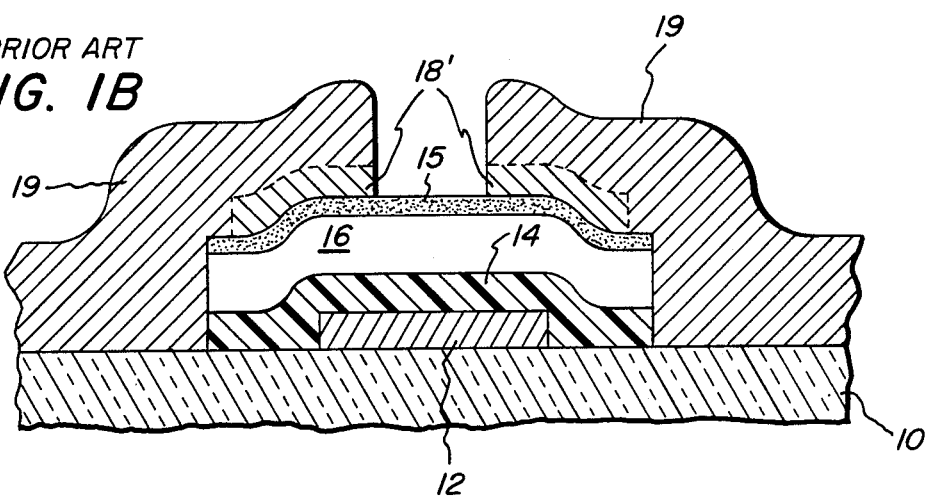
FIG. 1B is a cross-sectional side elevation view similar to FIG. 1A, but more particularly illustrating the deposition of source/drain contact material and the etching of a gap therein to form an inverted field effect transistor device.

FIGS. 1A and 1B are provided to particularly illustrate the fact that the present invention utilizes one less masking step than is provided by other processing methods. In particular, FIG. 1A illustrates one stage in the fabrication of an inverted, thin film field effect transistor. FIG. 1B illustrates a completed FET structure produced in accordance a process which is different than the present invention. The transistor structures shown in FIG. 1 are seen as being disposed upon a glass substrate 10. This is the typical situation in which these transistors are employed in liquid crystal display devices. However, in general, any insulative substrate material which is thermally compatible and non-reactive with other materials employed in the transistor is suitable for use as a substrate. It is also noted that the transistor structures as illustrated in the figures herein are referred to as inverted since the gate electrode is deposited at a lower point in the transistor structure.

In particular, FIG. 1A illustrates gate electrode 12 disposed on substrate 10. The disposition of gate electrode materials and conductive leads typically requires a separate masking and patterning step which is not specifically relevant to the practice of the present invention. However, following formation of metallic gate electrode patterns 12, insulative layer 14, typically comprising silicon nitride is deposited over the substrate. In a similar fashion, a layer of amorphous silicon material 16 is then deposited over insulative layer 14. Doped amorphous silicon layer 15 is then deposited in a conventional fashion using well known methods to produce layer 15 of doped N+ amorphous silicon. Next, a layer 18 of metallic material such as molybdenum is employed. Molybdenum layer 18 is employed for the purpose of enhancing electrical contact to the doped N+ amorphous silicon material 15. It is the improvement of this electrical contact to which the present invention is specifically addressed. In accordance with the process illustrated in FIGS. 1A and 1B, layer 18 is subject to a masking and patterning operation resulting in the formation of a mesa structure 18 shown in FIG. 1A. It is noted that this particular masking step is the one which is eliminated by the practice of the present invention. Nonetheless, in the process illustrated, a subsequent patterning and masking operation removes portions of layers 14, 15 and 16 so as to form island structures beneath the mesa structure shown. It is noted that if layer 18 is not removed or cut back into mesas prior to deposition and etching of source and drain electrode material, an overhang due to undercutting of the silicon/silicon nitride material is apt to develop and to cause step coverage problems for the source/drain metallization layer. Thus, the separate masking operations for mesa and island structures have been found to be highly desirable to prevent step coverage problems from occurring.

FIG. 1B illustrates the completion of a process for forming a thin film field effect transistor from the structure seen in FIG. 1A. In particular, a layer of conductive material 19, preferably comprising molybdenum is deposited and patterned as shown. In particular, patterning of the molybdenum material results in the formation of an aperture or gap which separates source and drain portions of the field effect transistor. It is noted that contact improvement layer 18 is divided into portions 18' as shown. While typically comprising the same material, preferably molybdenum, structures 18' and 19 are shown as distinct in FIG. 1B since the structures actually perform somewhat different functions. In particular, as noted above, molybdenum layer 18 (also designated as 18' after patterning) is relatively thin, namely approximately 50 nm, and serves solely to improve electrical contact to the doped amorphous silicon layer 15. However, a much thicker metallization layer 19 is actually employed to provide source and drain metallization patterning and connection of these device elements to the rest of the circuit. In general, in a liquid crystal display type device as described above, each pixel element is associated with a single FET device such as that shown in FIG. 1B (or in FIG. 2D as is more particularly discussed below with reference to the process of the present invention). It is also noted that the figures of the present invention are not shown to scale and, in particular, the dimensions in the vertical direction have been exaggerated so as to more readily provide a pictorial illustration of the invention and also to provide drawings which are more readily understood by those skilled in the microelectronic fabrication arts.

Figure 2A:
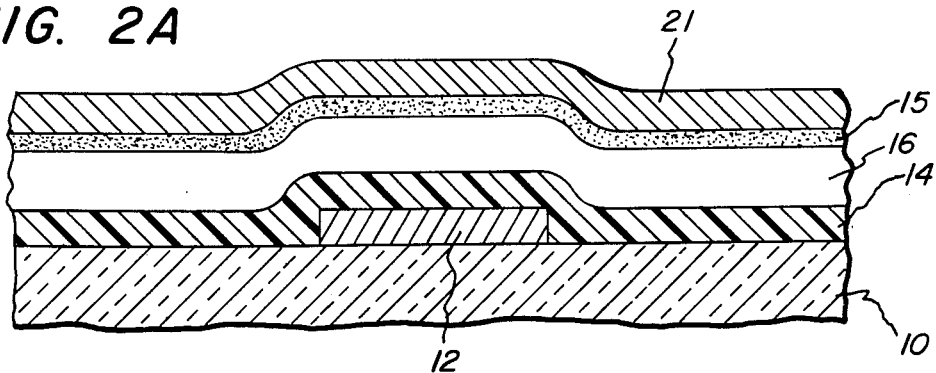
FIG. 2A is a cross-sectional side elevation view illustrating an initial process step in accordance with the present invention.
Figure 2B:
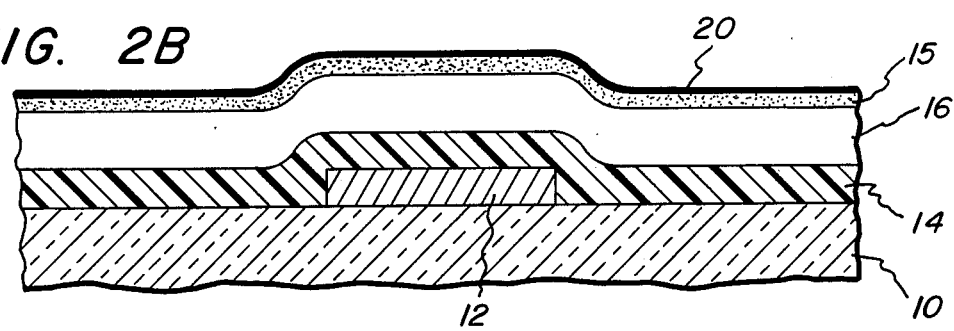
FIG. 2B is similar to FIG. 2A, but more particularly illustrates the removal of the thin layer of deposited molybdenum resulting in permanent alternation of the N+ amorphous silicon surface.

A process for carrying out the present invention is particularly illustrated in FIGS. 2A–2D. The processing required to produce the cross-section in FIG. 2A is typically the same processing that is employed in the construction of the device stage shown in FIG. 1A, as discussed above, up to and including the formation of doped amorphous silicon layer 15. In this regard, it is noted that while the doped region herein is referred to as a separate layer 15, it is nonetheless understood by those skilled in that art that this layer is actually formed by doping a portion of amorphous silicon layer 16 and as such, layers 15 and 16 essentially form a single structure with the exception that the uppermost regions of the amorphous silicon material are doped with a particular polarity dopant such as phosphorus.

Figure 2C:
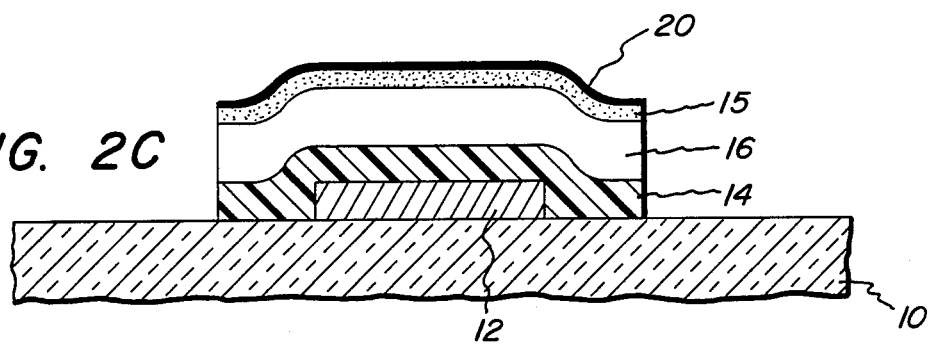
FIG. 2C is similar to FIG. 2B, but more particularly illustrates patterning via a mask step to form islands and particularly illustrating the absence of mesa structures.
Figure 2D:
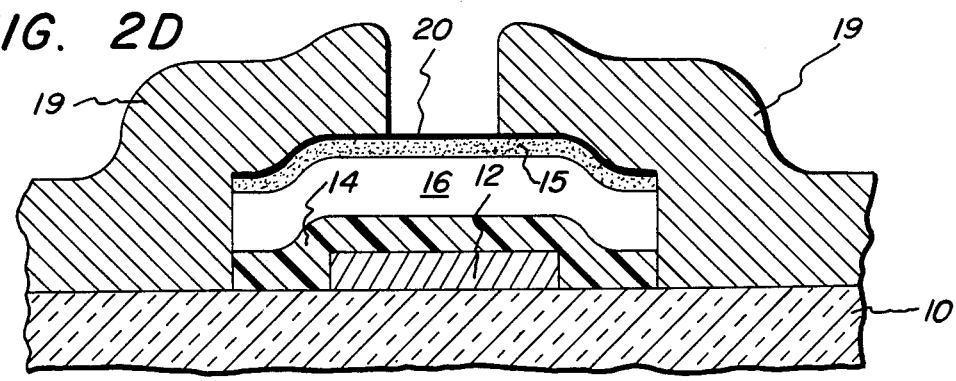
FIG. 2D is similar to FIG. 2C, but more particularly indicating the deposition and patterning of source/drain metallization.

However, FIG. 2A illustrates the deposition of a thin layer of molybdenum which is preferably sputtered onto the N+ doped amorphous silicon. This layer of molybdenum 21 is preferably approximately 50 nanometers in thickness, but may range from about 10 to about 100 nanometers in thickness. It is preferably deposited by sputtering, Also, in marked contrast to other processes, thin molybdenum layer 21 is removed. It is preferably removed by etching with a mixture of phosphoric, acetic, and nitric acids in an aqueous solution. This is typically referred to as a PAWN etch. Most importantly, it is noted that molybdenum layer 21 is removed without any patterning step being employed. This is in marked contrast to the process illustrated in FIGS. 1A and 1B. As a result of the deposition and removal of molybdenum layer 21, it is believed that a permanent alteration of N− doped amorphous silicon layer 15 is produced. This alteration is illustrated by heavy line 20 seen in FIGS. 2B, 2C and 2D. It is this permanent alteration which appears to produce the desirable characteristics of the present invention. In accordance with preferred embodiments of the present invention for forming thin film field effect transistors, the silicon/silicon nitride layer is then patterned into islands as described above. A typical resulting island is shown in FIG. 2C. It is particularly noted that mesa structures are absent in FIGS. 2C and 2D and that no problem of undercutting, overhanging or step coverage is present. Nonetheless, the alteration of the surface of N+ doped amorphous silicon 15 renders that surface much more susceptible to electrical contact with subsequently deposited molybdenum material 19 which is patterned as described above to produce source and drain metallization. The resulting structure is seen in FIG. 2D. It has been found that if the deposition of molybdenum layer 21 is omitted from the process, the yield of good electrical contacts is significantly reduced. It is also noted that experiments conducted clearly indicate that it is the deposition and subsequent removal of molybdenum layer 21 which results in the beneficial effects provided by the process of the present invention. In particular, it has been determined by electrical measurements that there is an alteration of the N+ silicon surface due to the deposition and removal of the molybdenum. Even after long etching in a PAWN etch to remove the molybdenum, the electrical conductivity of the N+ silicon is much higher than for untreated N+ silicon. Furthermore, sputter etching of the surface, followed by plasma etching sufficient to remove a small fraction of the N+ material, results in a dramatic reduction of the N+ conductivity in comparison with that observed from material exposed to molybdenum deposition and removal. This indicates that a permanent alteration of the N+ surface has occurred. This alteration persists even through multiple resist processing steps including cleaning steps and oxygen ashing. This altered surface is important for producing a good bond and contact between the thick molybdenum layer 19 which is deposited and patterned into source and drain metallization after formation of the islands.

In an alternate embodiment the first molybdenum cap is not removed until just prior to deposition of the source-drain metalization. This molybdenum cap protects the surface from contamination during intermediate processing steps such as ITO deposition and patterning. Subsequent etching of the molybdenum cap is also advantageous in that it strips the Si surface of the contaminants.

Accordingly, from the above, it should be appreciated that the process of the present invention significantly improves contact to doped amorphous silicon surfaces. It is further seen that the process of the present invention reduces the number of masking steps employed in the fabrication of thin film amorphous transistors. It is also seen that the process described herein is particularly advantageous for forming FET control device in matrix addressed liquid crystal displays. It is also seen that the processing time and the device yield associated with fabrication of such transistors is also improved by the process of the present invention.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The Invention claimed is:

1. A method for treating an N+ amorphous silicon surface to enhance electrical contact with said surface, said method comprising the steps of:
    depositing a layer of molybdenum on said N+ amorphous silicon surface; and
    removing said molybdenum layer.

2. The method of claim 1 in which said removal is performed by chemical etching.

3. The method of claim 2 in which the etching employed is a mixture of phosphoric, acetic and nitric acids in an aqueous solution.

4. The method of claim 1 in which said molybdenum layer deposited is between about 10 and 100 nanometers thick.

5. The method of claim 4 in which said molybdenum layer is approximately 50 nanometers thick.

6. The method of claim 1 further including a step of metal deposition at least on said amorphous silicon surface from which molybdenum has been removed.

7. The method of claim 6 further including a step of patterned removal of said second deposited metal.

8. The method of claim 6 in which said second deposited metal is molybdenum.

9. The method of claim 1 in which said layer of molybdenum is deposited by sputtering.

* * * * *